United States Patent
Wu et al.

(10) Patent No.: US 12,444,676 B2
(45) Date of Patent: *Oct. 14, 2025

(54) SELF-ALIGNED VIA FOR INTERCONNECT STRUCTURE

(71) Applicant: Taiwan Semiconductor Manufacturing Co., Ltd., Hsinchu (TW)

(72) Inventors: Chieh-Han Wu, Kaohsiung (TW); Cheng-Hsiung Tsai, Miaoli County (TW); Chih Wei Lu, Hsinchu (TW); Chung-Ju Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/745,773

(22) Filed: Jun. 17, 2024

(65) Prior Publication Data
US 2024/0339396 A1    Oct. 10, 2024

Related U.S. Application Data

(63) Continuation of application No. 18/301,447, filed on Apr. 17, 2023, now Pat. No. 12,046,551, which is a
(Continued)

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/76802* (2013.01); *H01L 21/76816* (2013.01); *H01L 21/76829* (2013.01); *H01L 21/76843* (2013.01); *H01L 21/7685* (2013.01); *H01L 23/53209* (2013.01); *H01L 23/53223* (2013.01); *H01L 23/53238* (2013.01); *H01L 23/53266* (2013.01);
(Continued)

(58) Field of Classification Search
CPC ......... H01L 23/76834; H01L 23/76843; H01L 23/53238; H01L 23/5226; H01L 23/53223; H01L 23/53266; H01L 23/53209; H01L 24/32; H01L 24/37; H01L 21/76802; H01L 21/76816; H01L 21/76829; H01L 21/76843; H01L 21/7685; H01L 21/76831; H01L 21/76877; H01L 23/5329
See application file for complete search history.

(56) References Cited

U.S. PATENT DOCUMENTS 6,723,636 B1    4/2004  Russell
9,520,362 B2    12/2016 Lin
(Continued)

*Primary Examiner* — Alonzo Chambliss
(74) *Attorney, Agent, or Firm* — HAYNES AND BOONE, LLP

(57) ABSTRACT

Interconnect structures and methods of forming the same are provided. An interconnect structure according to the present disclosure includes a conductive line feature over a substrate, a conductive etch stop layer over the conductive line feature, a contact via over the conductive etch stop layer, and a barrier layer disposed along a sidewall of the conductive line feature, a sidewall of the conductive etch stop layer, and a sidewall of the contact via.

20 Claims, 13 Drawing Sheets

Related U.S. Application Data continuation of application No. 17/671,394, filed on Feb. 14, 2022, now Pat. No. 11,631,639, which is a continuation of application No. 16/572,683, filed on Sep. 17, 2019, now Pat. No. 11,251,118.

(51) Int. Cl.
*H01L 23/00* (2006.01)
*H01L 23/532* (2006.01)

(52) U.S. Cl.
CPC .............. *H01L 24/32* (2013.01); *H01L 24/37* (2013.01); *H01L 2924/181* (2013.01)

(56) References Cited

U.S. PATENT DOCUMENTS

| | | | |
|---|---|---|---|
| 9,613,856 | B1 | 4/2017 | Yang |
| 9,716,032 | B2 | 7/2017 | Tang |
| 9,972,529 | B2 | 5/2018 | Yang |
| 10,163,691 | B2 | 12/2018 | Shih |
| 10,163,786 | B2 | 12/2018 | Yang |
| 10,170,322 | B1 | 1/2019 | Cheng |
| 10,529,920 | B1 | 1/2020 | Feng |
| 11,251,118 | B2 | 2/2022 | Wu |
| 11,631,639 | B2 | 4/2023 | Wu |
| 12,046,551 | B2 * | 7/2024 | Wu .................. H01L 21/76897 |
| 2008/0026564 | A1 | 1/2008 | Frohberg |
| 2008/0096380 | A1 | 4/2008 | Ko |
| 2010/0078821 | A1 | 4/2010 | Kahlert et al. |
| 2010/0090342 | A1 | 4/2010 | Chang |
| 2012/0007208 | A1 | 1/2012 | Kim |
| 2014/0131841 | A1 | 5/2014 | Tseng |
| 2014/0151888 | A1 | 6/2014 | Tsai |
| 2015/0061141 | A1 | 3/2015 | Tung |

* cited by examiner

SELF-ALIGNED VIA FOR INTERCONNECT STRUCTURE

PRIORITY DATA

This application is a continuation of U.S. patent application Ser. No. 18/301,447, filed Apr. 17, 2023, which is a continuation of U.S. patent application Ser. No. 17/671,394, filed Feb. 14, 2022, which is a continuation of U.S. patent application Ser. No. 16/572,683, filed Sep. 17, 2019, the entirety of which is incorporated by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, when forming an interconnect structure with metal lines and contact vias, the contact vias may be misaligned with the metal lines, resulting in leakage or increased resistivity. Accordingly, although existing interconnect structures and methods have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
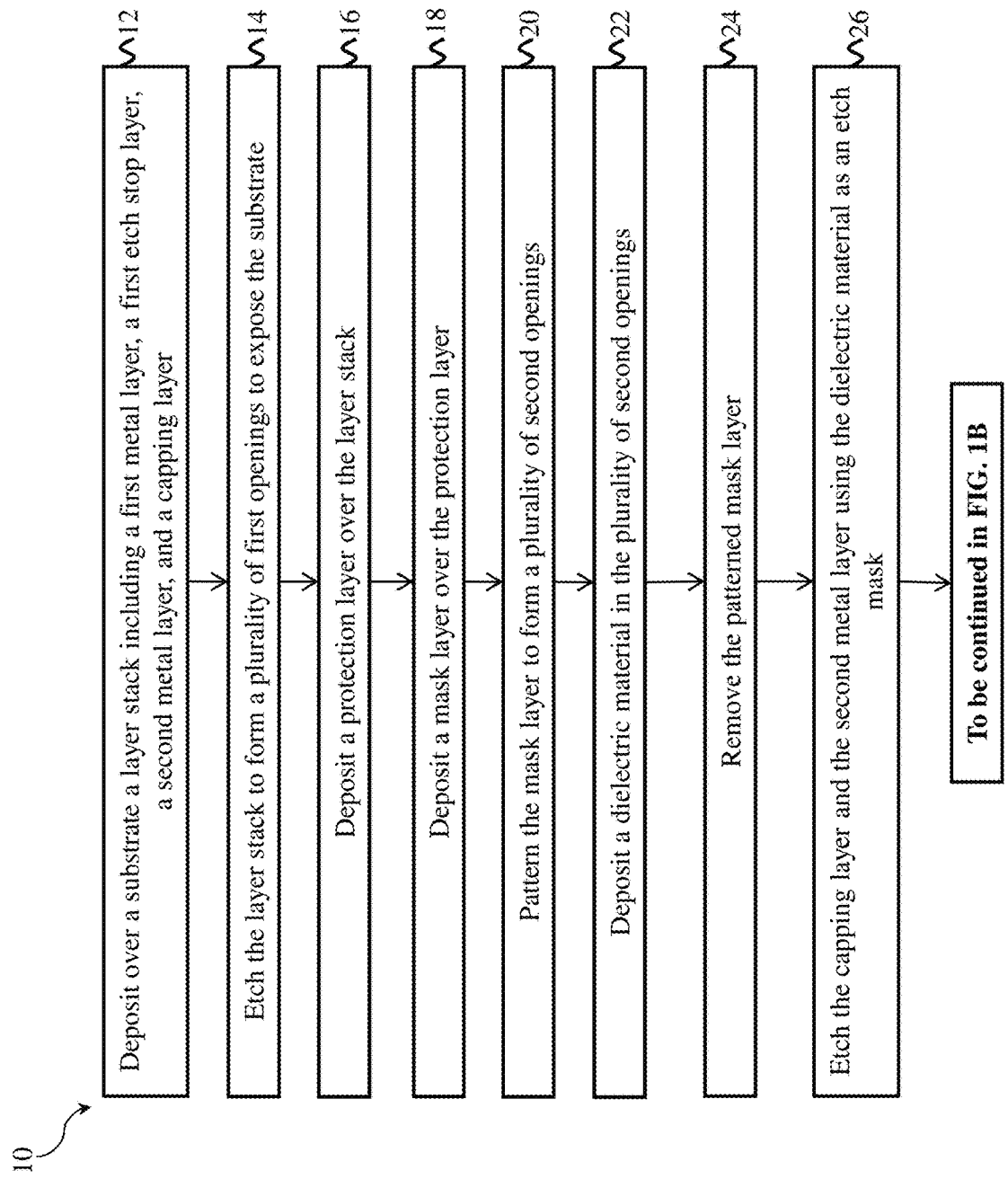
FIGS. 1A and 1B illustrate a flow chart of a method for fabricating an interconnect structure of an integrated circuit device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating a multilayer interconnect (MLI) feature that interconnects IC features fabricated by FEOL and MEOL (referred to herein as FEOL and MEOL features or structures, respectively), thereby enabling operation of the IC devices.

The present disclosure generally relates to BEOL processes directed at fabricating an MLI structure for planar IC devices and/or non-planar IC devices (for example, fin-like field effect transistors (FinFETs)). An MLI structure may include a plurality of conductive layers. Conventionally, after an MEOL conductive feature (such as source/drain contact) or a lower-level BEOL conductive feature (such as the first metal layer over an MEOL conductive feature) is formed, a dual damascene process may be used to form thereon further conductive features, such as metal lines and contact vias. When dual damascene processes are used to form interconnect structures of reduced dimensions, a via opening for a contact via may be misaligned with the conductive feature. In case of such misalignment, the via opening may extend downward along a sidewall of the conductive feature, resulting in a tooth-like extension of the via opening. When the via opening is filled with a metal fill material, the tooth-like extension may also be filled or partially filled with the metal fill material to form a feature nicknamed a "tiger tooth." Accordingly, a misalignment between a via opening and a conductive feature not only may reduce contact area between the via opening and the conductive feature but also may bring about leakage due to formation of "tiger teeth." Methods for fabricating an interconnect structure disclosed herein include forming a layer stack having a first metal layer, a conductive etch stop layer over the first metal layer, and a second metal layer over the conductive etch stop layer and forming conductive line features from the first metal layer and contact vias from the second metal layer using reactive ion etch (RIE). As such, the conductive line features and the contact vias over them are automatically self-aligned. Interconnect structures disclosed herein have thus been observed to provide reduced leakage. In addition, due to the anisotropic nature of RIE, sidewalls of the contact vias may be substantially perpendicular to the substrate, allowing a higher pattern density. Different embodiments may have different advantages, and no particular advantage is required of any embodiment.

Figure 1B:
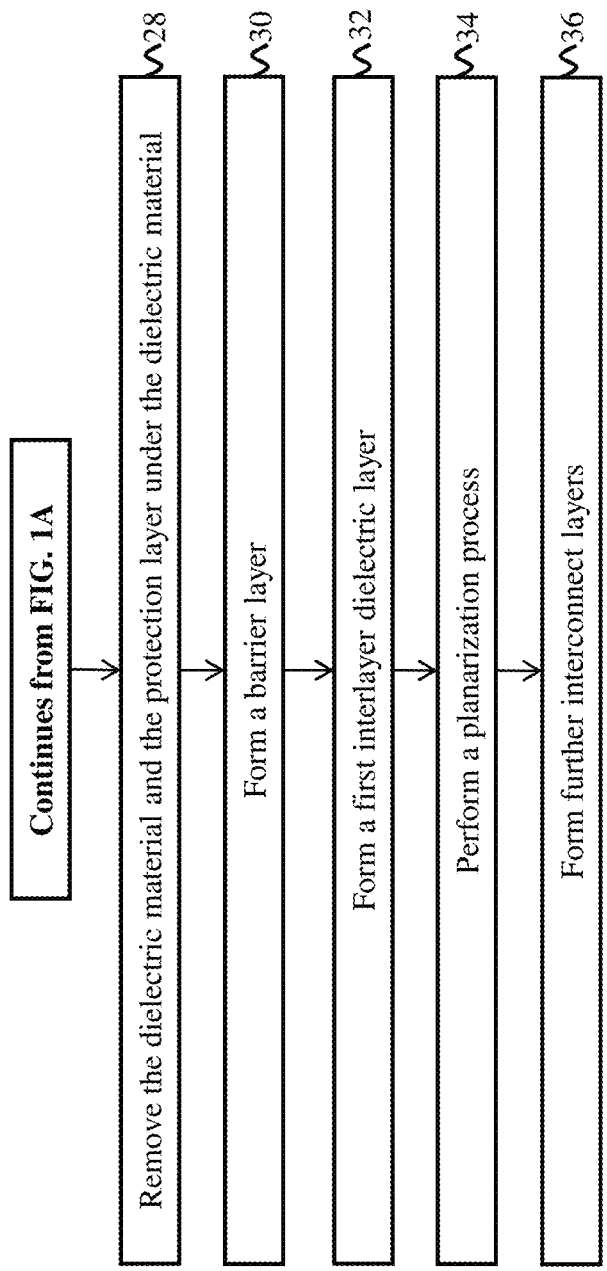

FIGS. 1A and 1B collectively illustrate a flow chart of a method 10 for fabricating an interconnect structure of an integrated circuit (IC) device according to various aspects of the present disclosure. Additional steps can be provided before, during, and after the method 10, and some of the steps described can be replaced or eliminated for other embodiments of the method 10. Blocks of the method 10 of FIGS. 1A and 1B may be better described in conjunction with FIGS. 2-12, which are fragmentary cross-sectional diagrammatic views of a workpiece 100 of an IC device at various fabrication stages of a method, such as method 10 of FIGS. 1A and 1B. The IC device to be formed on workpiece 100 can be included in a microprocessor, a memory, and/or other IC device. In some implementations, workpiece 100 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or non-planar transistors, such as fin-like FETs (FinFETs) or gate-all-around (GAA) transistors. FIGS. 2-12 have been simplified for the sake of clarity to better understand the inventive concepts of the present disclosure. Additional features can be added in workpiece 100, and some of the features described below can be replaced, modified, or eliminated in other embodiments of workpiece 100.

Figure 2:
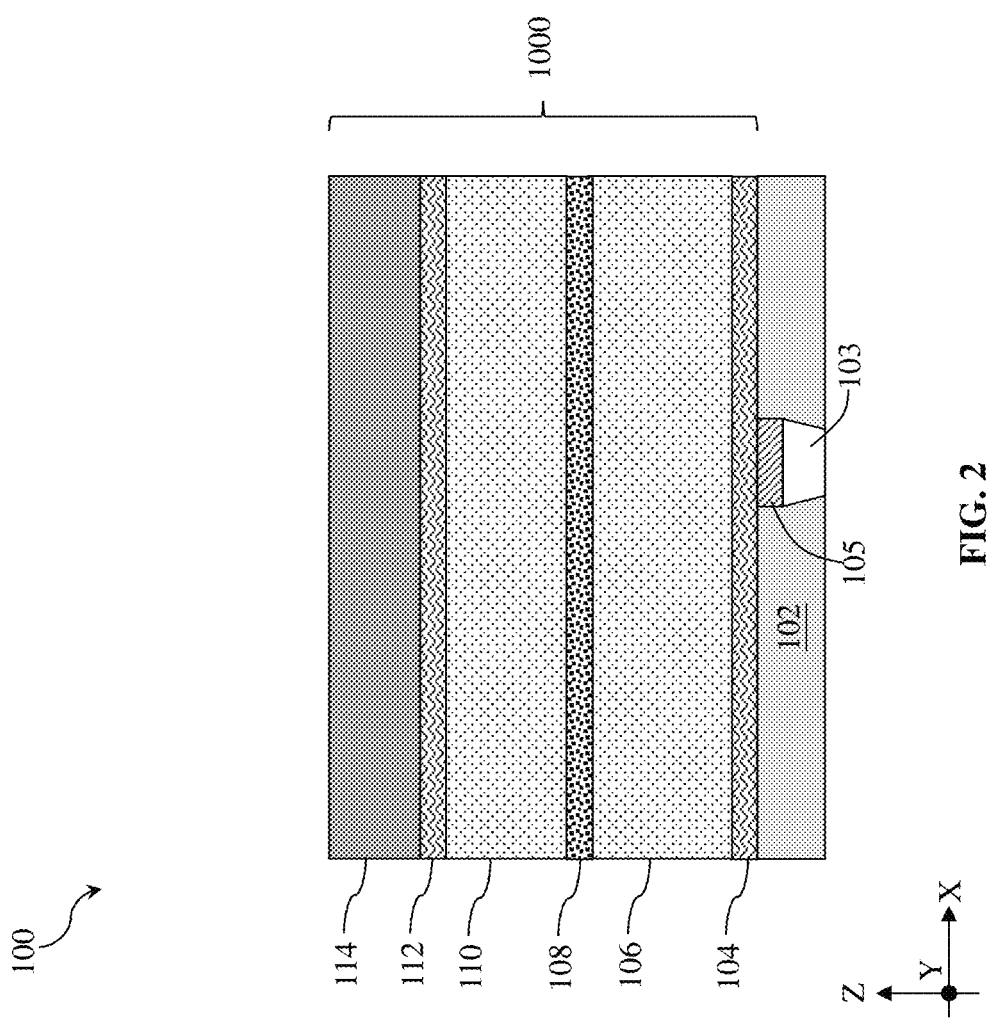
FIGS. 2-12 are fragmentary cross-sectional diagrammatic views of an interconnect structure at various fabrication stages of a method, such as the method of FIG. 1, according to various aspects of the present disclosure.

Referring now to FIGS. 1A and 2, the method 10 includes a block 12 where a layer stack 1000 is deposited over a substrate 102. In some embodiments, the layer stack 1000 includes a first metal layer 106, a conductive etch stop layer 108 over the first metal layer 106, a second metal layer 110 over the conductive etch stop layer 108, and a cap layer 114 over the second metal layer 110. In some implementations, to improve adhesion between the first metal layer 106 and the substrate 102, the layer stack 1000 may further include a first glue layer 104 between the first metal layer 106 and the substrate 102. Similarly, to improve adhesion between the second metal layer 110 and the cap layer 114, the layer stack 1000 may further include a second glue layer 112 between the second metal layer 110 and the cap layer 114. In some embodiments, the first metal layer 106, the conductive etch stop layer 108 and the second metal layer 110 may include copper (Cu), cobalt (Co), ruthenium (Ru), molybdenum (Mo), chromium (Cr), tungsten (W), manganese (Mn), rhodium (Rd), iridium (Ir), nickel (Ni), palladium (Pd), platinum (Pt), silver (Ag), gold (Au), tantalum (Ta), aluminum (Al), and a combination thereof. In these embodiments, the composition of the conductive etch stop layer 108 is different from that of the first metal layer 106 or the second metal layer 110 to provide etching selectivity. In addition, in these embodiments, the composition of the first metal layer 106 and that of the second metal layer 110 may or may not be the same. In one example, both the first metal layer 106 and the second metal layer 110 are made of ruthenium while the conductive etch stop layer 108 is formed of tantalum and tungsten.

In some embodiments, the cap layer 114 serves as a hard mask and may include silicon, silicon nitride, silicon carbonitride, silicon oxynitride, silicon oxycarbide, metal (Cu, Co, Ru, Mo, Cr, W, Mg, Rd, Ir, Ni, Pd, Pt, Ag, Au, Ta, Al, or a combination thereof), or metal nitride (such as tantalum nitride). In some implementations, the cap layer 114 may have a thickness between about 5 Å and about 1000 Å. The substrate 102 may include various FEOL features and devices, such as transistors, and various MEOL conductive features, such as source/drain contacts or gate contacts. An MEOL conductive feature 103 is illustrated in FIG. 2. In some instances, the MEOL conductive feature 103 may be a source/drain contact or a gate contact. The MEOL conductive feature 103 may be formed of Cu, Co, Ru, Mo, Cr, W, Mg, Rd, Ir, Ni, Pd, Pt, Ag, Au, Ta, Al, or a combination thereof. In some implementations, an MEOL cap layer 105 may be formed over the MEOL conductive feature 103. The MEOL cap layer 105 may be formed of a metal (Cu, Co, Ru, Mo, Cr, W, Mg, Rd, Ir, Ni, Pd, Pt, Ag, Au, Ta, Al, or a combination thereof), or a metal nitride of the foregoing metal material. Both the MEOL conductive feature 103 and the MEOL cap layer 105 may be formed within a first interlayer dielectric (ILD) layer, which may include silicon oxide. Accordingly, a top surface of the substrate 102 may include a top surface of the MEOL cap layer 105 and a top surface of the first ILD layer.

In some embodiments, the first glue layer 104 and the second glue layer 112 may be formed of silicon, silicon nitride, silicon carbonitride, silicon oxynitride, silicon oxycarbide, a metal (Cu, Co, Ru, Mo, Cr, W, Mg, Rd, Ir, Ni, Pd, Pt, Ag, Au, Ta, Al, or a combination thereof), a metal oxide of the foregoing metal, or a metal nitride of the foregoing metal. In some implementations, each of the first glue layer 104 and the second glue layer 112 has a thickness between about 5 Å and about 200 Å. As the first glue layer 104 and the second glue layer 112 function to promote adhesion, the first glue layer 104 is different from the first metal layer 106 and the substrate 102 and the second glue layer 112 is different from the second metal layer 110 and the cap layer 114.

The layer in the layer stack 1000 may be deposited using chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), electroplating, electroless plating, other suitable methods, or combinations thereof.

Figure 3:
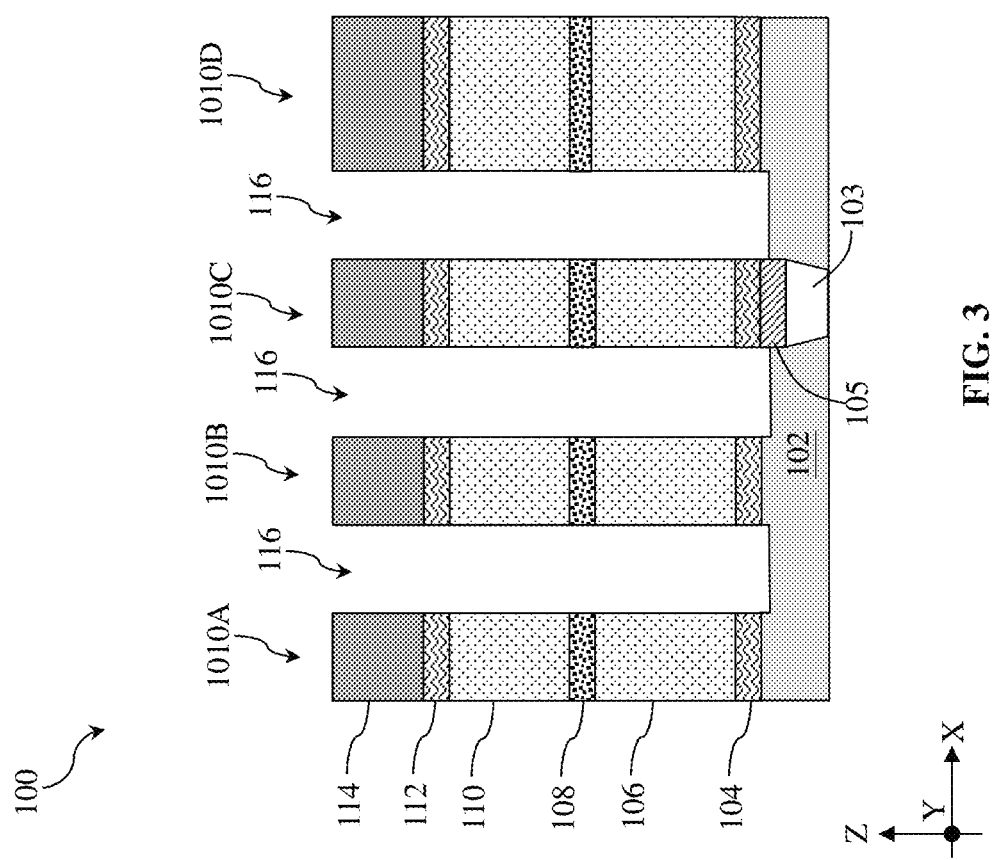

Referring now to FIGS. 1A and 3, the method 10 includes a block 14 where the layer stack 1000 is etched to form a plurality of first openings 116. In some embodiments, the layer stack 1000 is etched using an anisotropic etch process, such as RIE, to form layer stack features 1010A, 1010B, 1010C, and 1010D each having substantially perpendicular sidewalls that are exposed in the plurality of first openings 116. In some embodiments, the RIE etch process at block 14 may include chlorine ($Cl_2$), silicon tetrachloride ($SiCl_4$), fluorocarbons (such as tetrafluoromethane ($CF_4$), hexafluoroethane ($C_2F_6$), hexafluoro-1,3-butadiene ($C_4F_6$), or octafluorocyclobutane ($C_4F_8$)), hydrogen ($H_2$), oxygen ($O_2$), hydrogen fluoride (HF), nitrogen trifluoride ($NF_3$), hydrogen bromide (HBr), fluorinated hydrocarbons ($CH_xF_y$), helium (He), or argon (Ar). The plasma at the RIE etch process at block 14 may be inductively coupled plasma (ICP) or capacitively coupled plasma (CCP). In some embodiments where the first glue layer 104 is present and electrically conductive, the etching at block 14 may etch through the first glue layer into the substrate 102 to ensure that the first glue layer 104 is severed at the plurality of first openings 116. That is, in those embodiments, the first openings 116 extend below a bottom surface of the first glue layer 104 and into the substrate 102.

Figure 4:
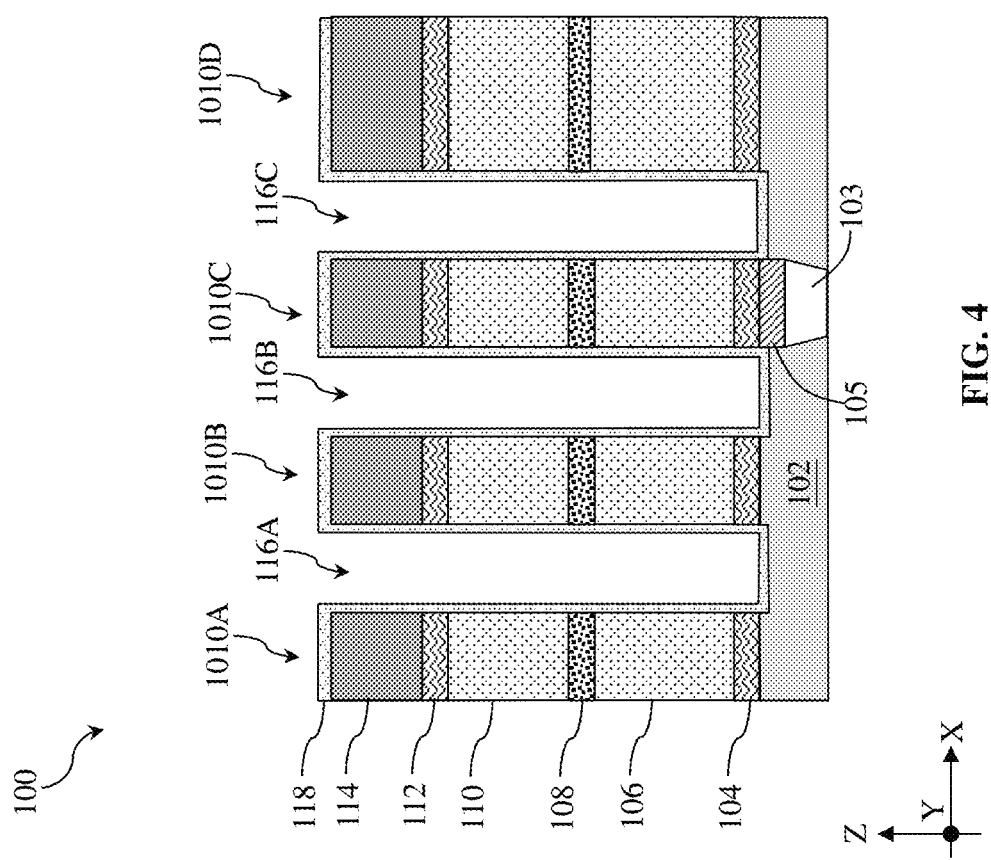

Referring now to FIGS. 1A and 4, the method 10 includes a block 16 where a protection layer 118 is deposited over the layer stack 1000. In some embodiments represented in FIG. 4, the protection layer 118 may be deposited along sidewalls and over top surfaces of the layer stack features 1010A, 1010B, 1010C, and 1010D. In some embodiments, the protection layer 118 serves as an insulator and an etch stop layer and may be formed of silicon, silicon oxide, silicon nitride, silicon carbide, silicon oxynitride, silicon oxycarbide, metal nitride, metal oxide, a suitable material, or a combination thereof. In some implementations, the protection layer 118 may be deposited using ALD, HDPCVD, PECVD, ALCVD, or other suitable method.

Figure 5:
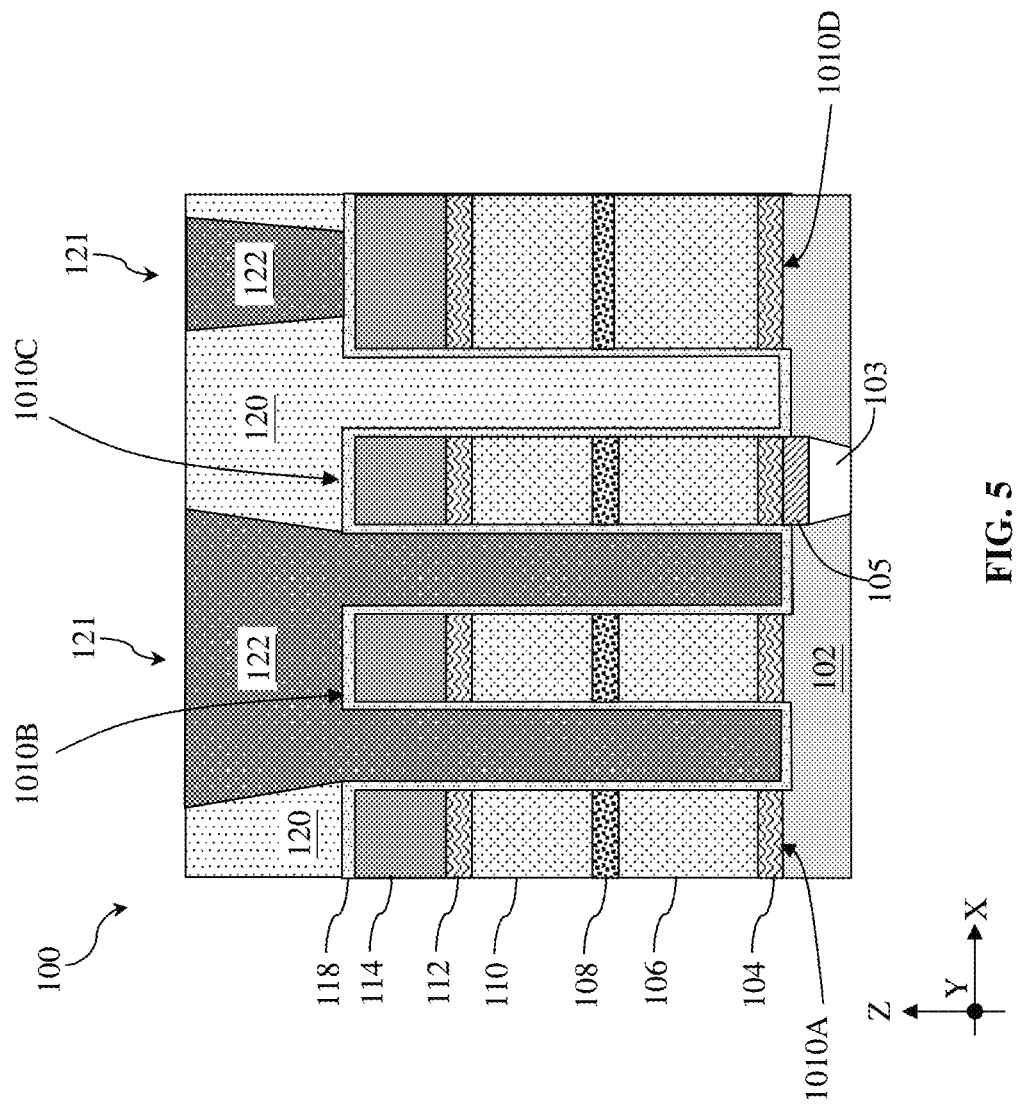

Referring now to FIGS. 1A and 5, the method 10 includes a block 18 where a mask layer 120 is deposited over the protection layer 118. In some embodiments, the mask layer 120 may be a bottom layer of a multilayer that includes a photoresist layer, a silicon hard mask layer, and the bottom layer. The mask layer 120 may include carbon-rich silicon oxide, carbon-rich silicon nitride, a bottom antireflective layer (BARC), organic materials, additives or other suitable dielectric layer. In some implementations, the mask layer 120 may be formed by spin-on coating, CVD, or other suitable process.

Referring still to FIGS. 1A and 5, the method 10 includes a block 20 where the mask layer 120 is patterned to form a plurality of second openings 121. In some embodiments, the operations at block 20 include a lithography process to pattern the mask layer to form a patterned hard mask. In some instances, a silicon hard mask layer is deposited over the mask layer and a photoresist layer is formed over the silicon hard mask layer. The photoresist layer is exposed to radiation reflected off or through a photolithography mask for patterning and then developed to form a patterned photoresist. The pattern of the patterned photoresist is then transferred to the silicon hard mask and the mask layer 120 to form a patterned mask layer 120 that includes the plurality of second openings 121. As will be clear from the description below, the shape and profile of the plurality of the second openings 121 depend on whether a contact via is coterminous with a conductive line feature therebelow. For example, the contact via and the conductive line feature to be formed from the layer stack feature 1010B are substantially coterminous when viewed from the Y direction. In contrast, the contact via to be formed from the layer stack feature 1010D is narrower than the conductive line feature to be formed from the layer stack feature 1010D. In some embodiments, a bottom surface of a second opening 121 may terminate on the protection layer 118 over the cap layer 114. In other embodiments, a second opening 121 may extend along a first opening 116 and a bottom surface of the second opening 121 may terminate on the protection layer 118 over the substrate 102.

Referring to FIGS. 1A and 5, the method 10 may include a block 22 where a dielectric layer 122 is deposited in the plurality of second openings 121. In some embodiments, the dielectric layer 122 may be referred to as reverse material. In some implementations, the dielectric layer 122 may include silicon, silicon oxide, silicon nitride, silicon carbide, silicon oxynitride, silicon oxycarbide, metal nitride, metal oxide, or a combination thereof. The dielectric layer 122 serves as a mask to protect portions of the second metal layer 110 that are to form contact vias. In some embodiments shown in FIG. 5, the dielectric layer 122 may completely wrap the layer stack feature 1010B to protect the second metal layer 110 in the layer stack feature 1010B and the dielectric layer 122 may be disposed over a portion of layer stack feature 1010D to protect a portion of the second metal layer 110 in the layer stack feature 1010D.

Figure 6:
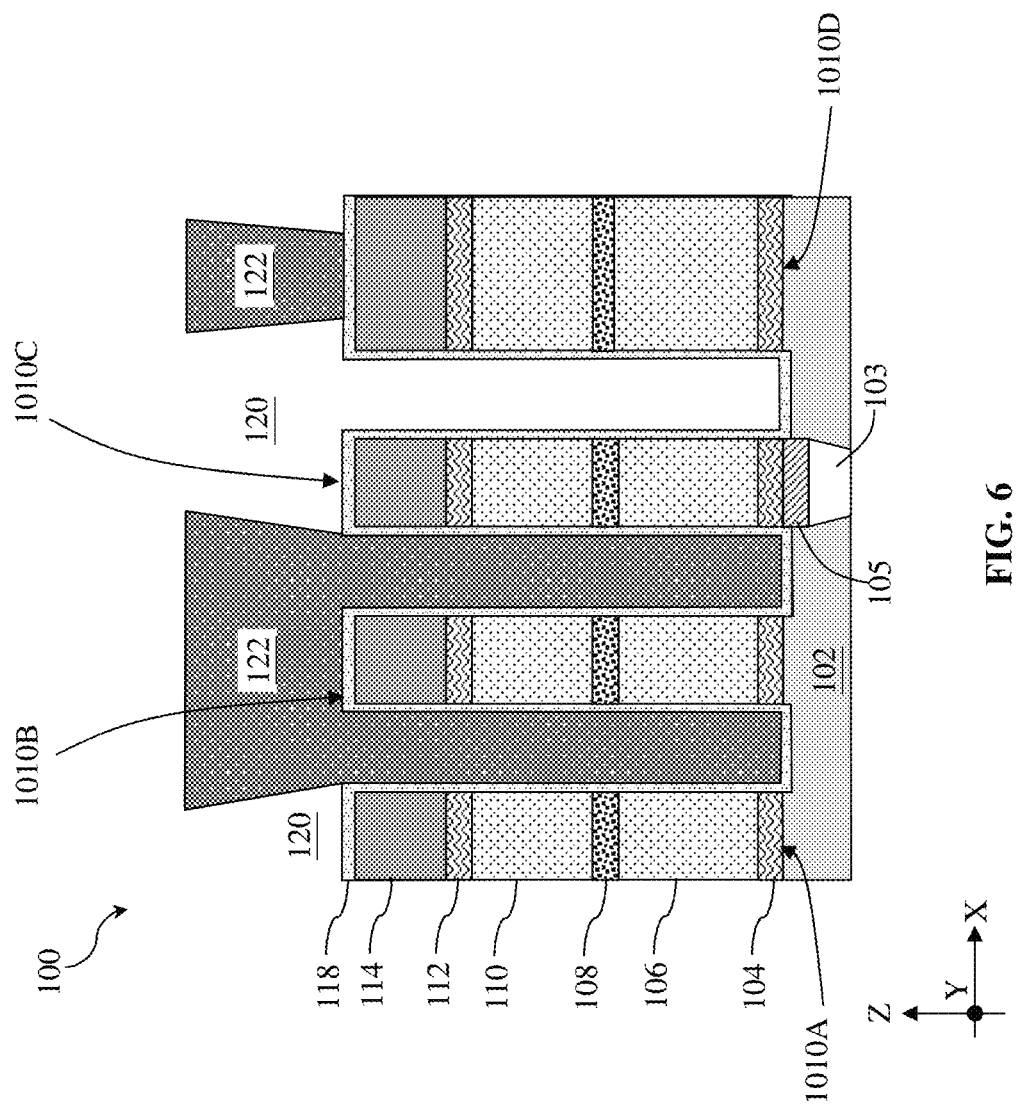

Referring to FIGS. 1A and 6, the method 10 may include a block 24 where the patterned mask layer 120 is removed. In some embodiments, the pattern mask layer 120 may be removed by ashing or a suitable process.

Figure 7:
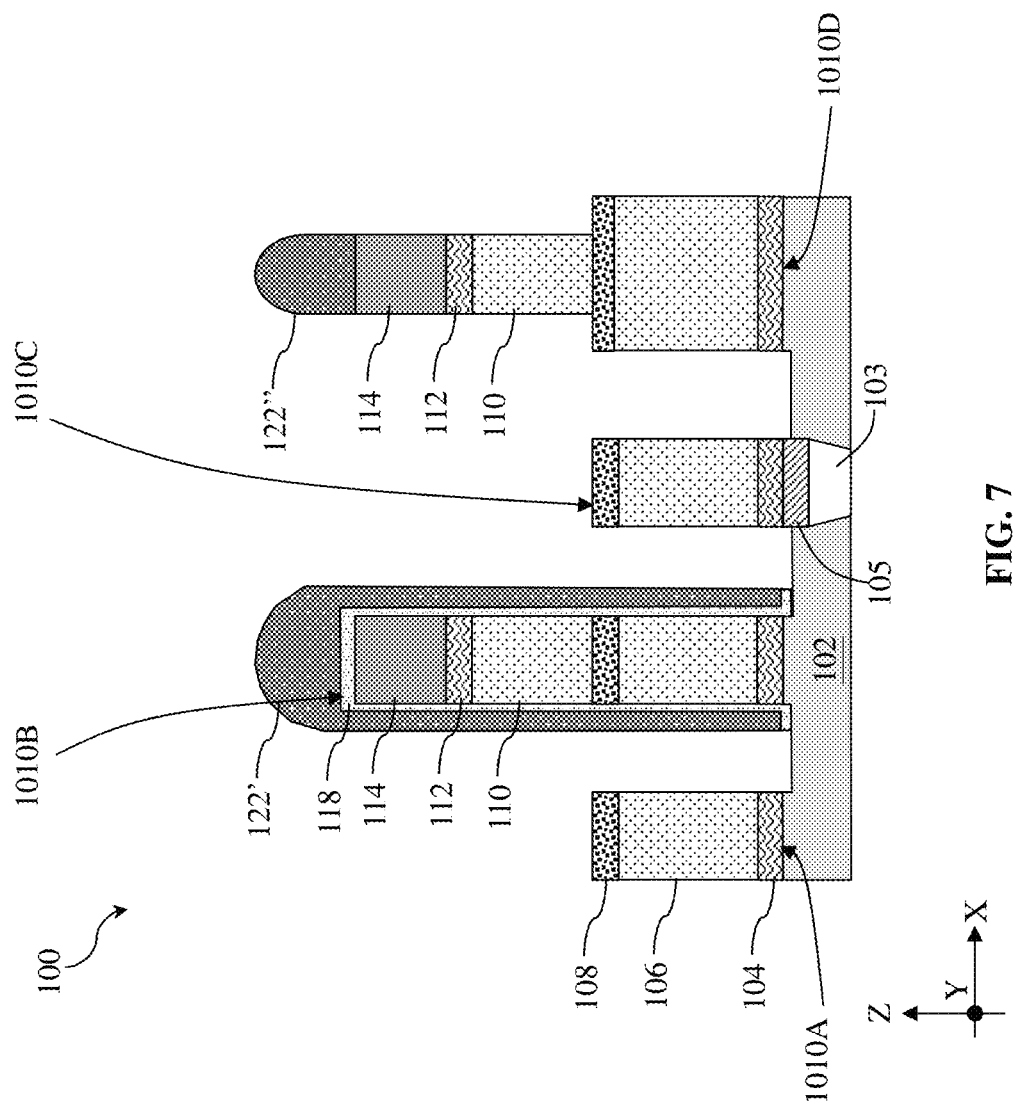

Referring now to FIGS. 1A and 7, the method 10 may include a block 26 where the cap layer 114, the second glue layer 112 (if present) and the second metal layer 110 are etched using the dielectric layer 122 as an etch mask. In some embodiments, the etch process at block 26 may be similar to the etch process at block 14. In some implementations, block 26 includes an anisotropic etch process, such as RIE, to etch the cap layer 114, the second glue layer 112 (if present) and the second metal layer 110 that are not covered/protected by the dielectric layer 122. In some instances, the RIE etch process at block 26 may include chlorine ($Cl_2$), fluorocarbons (such as tetrafluoromethane ($CF_4$), hexafluoroethane ($C_2F_6$)), hexafluoro-1,3-butadiene ($C_4F_6$), or octafluorocyclobutane ($C_4F_8$)), hydrogen ($H_2$), oxygen ($O_2$), hydrogen fluoride (HF), nitrogen trifluoride ($NF_3$), hydrogen bromide (HBr), fluorinated hydrocarbons ($CH_xF_y$), helium (He), or argon (Ar). The plasma at the RIE etch process at block 26 may be inductively coupled plasma (ICP) or capacitively coupled plasma (CCP). In some implementations, because the conductive etch stop layer 108 is selected such that the etch process at block 26 etches the conductive etch stop layer 108 more slowly than it etches the cap layer 114, the second glue layer 112, and the second metal layer 110. In some embodiments represented in FIG. 7, the dielectric layer 122 protects the layer stack feature 1010B and the layer stack feature 1010B remains covered by the etched dielectric layer 122' at conclusion of the block 26. Similarly, the dielectric layer 122 protects a portion of the layer stack feature 1010D and the portion of the layer stack feature 1010D covered by the dielectric layer 122 remains covered by the etched dielectric layer 122" at conclusion of the block 26. Because the layer stack features 1010A and 1010C are not protected by the dielectric layer 122, the cap layer 114, the second glue layer 112 and the second metal layer 110 in the layer stack features 1010A and 1010C may be completely removed, exposing the conductive etch stop layer 108.

Figure 8:
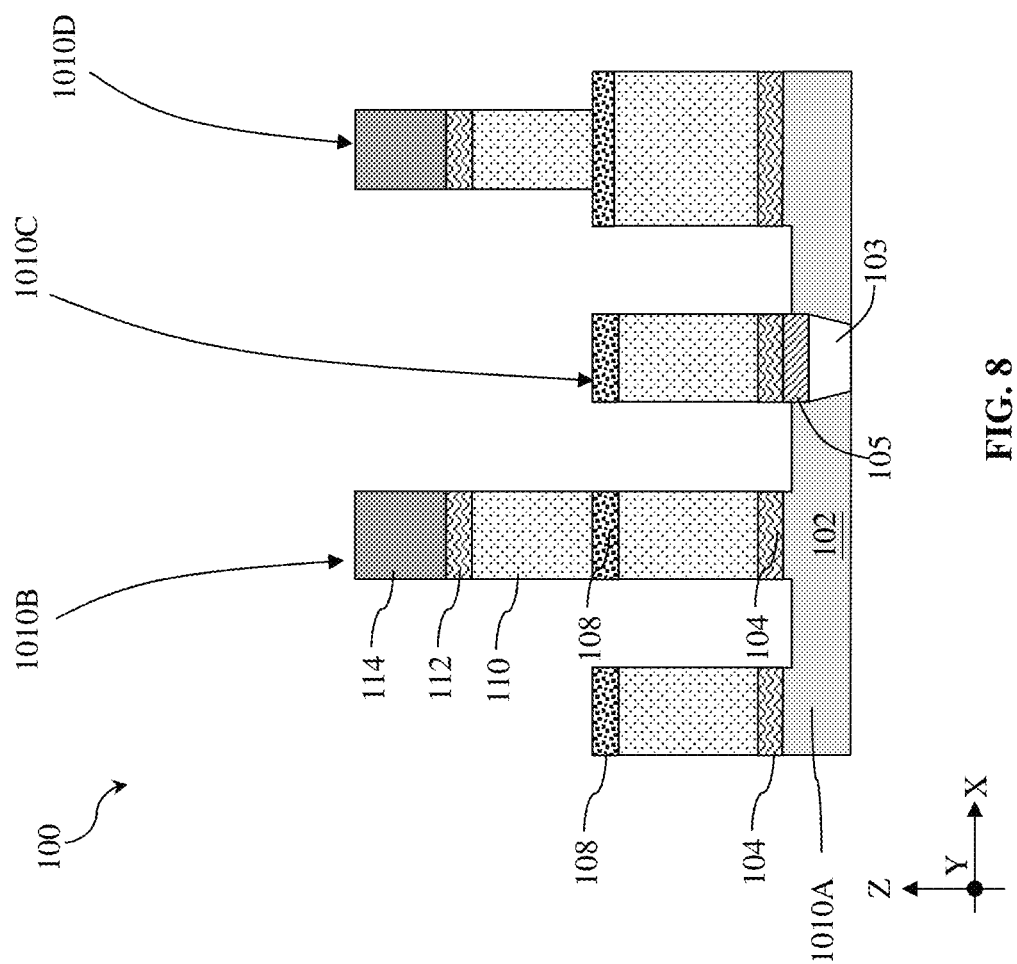

Referring now to FIGS. 1B and 8, the method 10 may include a block 28 where the dielectric layer 122 (including etched dielectric layer 122' and etched dielectric layer 122" in FIG. 7) and the protection layer 118 under the dielectric layer 122 are removed. In some embodiments, the dielectric layer 122 and the protection layer 118 over the substrate 102 may be removed by dry etch, wet etch, or a suitable etch process. In some implementations, the etch process at block 28 may be tuned to selectively etch the dielectric layer 122 and the protection layer 118 such that the first metal layer 106, the conductive etch stop layer 108, and the second metal layer 110 are substantially unetched at block 28.

Figure 9:
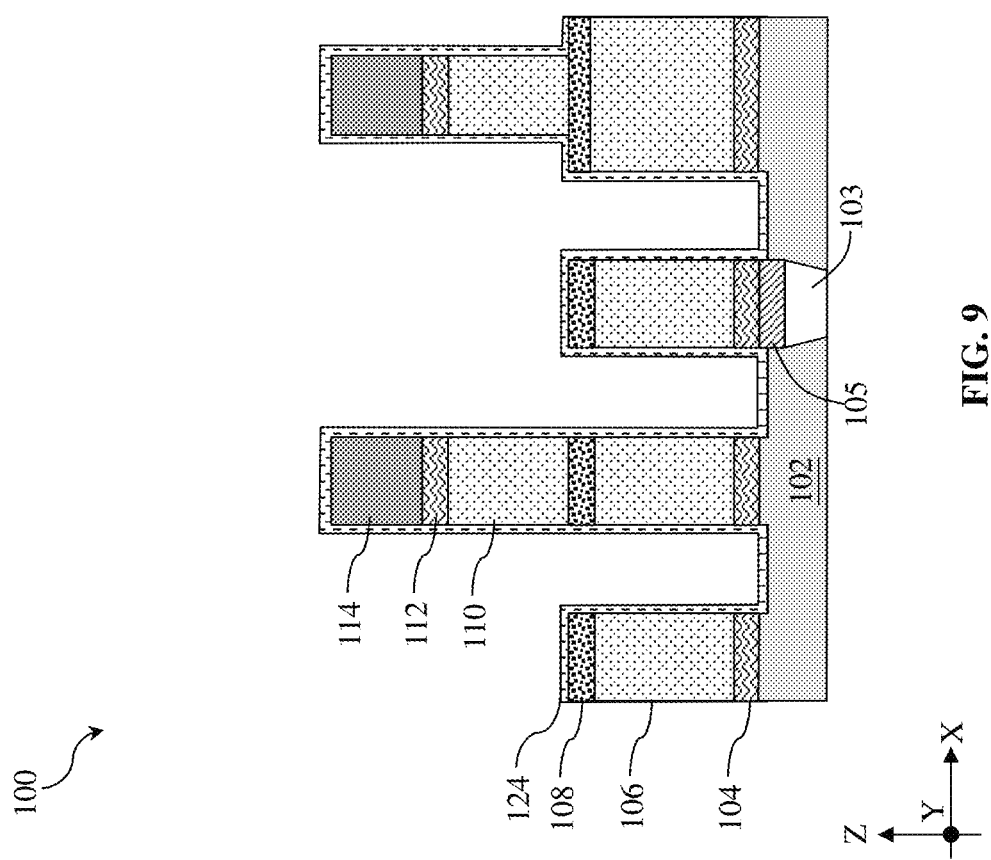

Referring now to FIGS. 1B and 9, the method 10 includes a block 30 where a first barrier layer 124 is formed. The first barrier layer 124 blocks oxygen diffusion from dielectric layers into the first metal layer 106, conductive etch stop layer 108 or the second metal layer 110. In some embodiments, the first barrier layer 124 spans across several conductive line features and contact via and is formed of an insulative dielectric material. In some implementations, the first barrier layer 124 may be formed of a nitrogen containing dielectric material. For example, the first barrier layer 124 may be formed of silicon carbonitride, silicon nitride, silicon oxycarbide, metal nitride, metal oxide, or a combination thereof. In some instances, the workpiece 100 may be annealed at a temperature between about 200° C. and about 500° C. to enhance adhesion between the first barrier layer 124 and the first metal layer 106 as well as between the first barrier layer 124 and the second metal layer 110. The first barrier layer 124 may be deposited using PVD, CVD, ALD, or other suitable methods.

Figure 10:
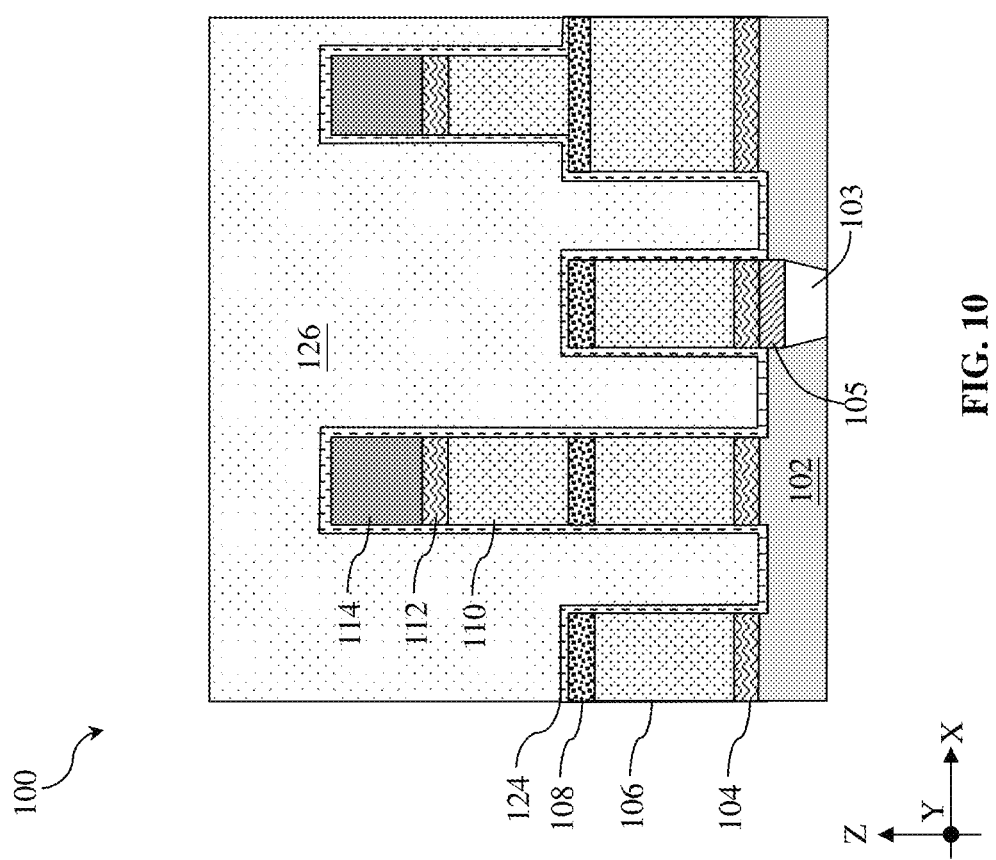

Referring now to FIGS. 1B and 10, the method 10 includes a block 32 where a second interlayer dielectric (ILD) layer 126 is formed. In some embodiments, the second ILD layer 126 may include silicon, oxygen, carbon, hydrogen, or nitrogen. In some implementations, the carbon content in the second ILD layer 126 ranges between about 0% and about 50%. A dielectric constant of the second ILD layer 126 is between about 2.0 and about 4. A porosity of the second ILD layer 126 is between about 0.1 and about 10. A hardness of the second ILD layer 126 is between about 0.1 and about 10. In some instances, the second ILD layer 126 may be deposited as a flowable dielectric material and may include tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. In the depicted embodiment, the second ILD layer 126 includes an oxide-containing dielectric material. The second ILD layer 126 may include a multi-layer structure or a single-layer structure and may be formed by a deposition process such as, for example, CVD, flowable CVD (FCVD), spin-on-glass (SOG), other suitable methods, or combinations thereof. In some embodiments, the second ILD layer 126 has a thickness along the Z direction between about 10 nm and about 200 nm.

Figure 11:
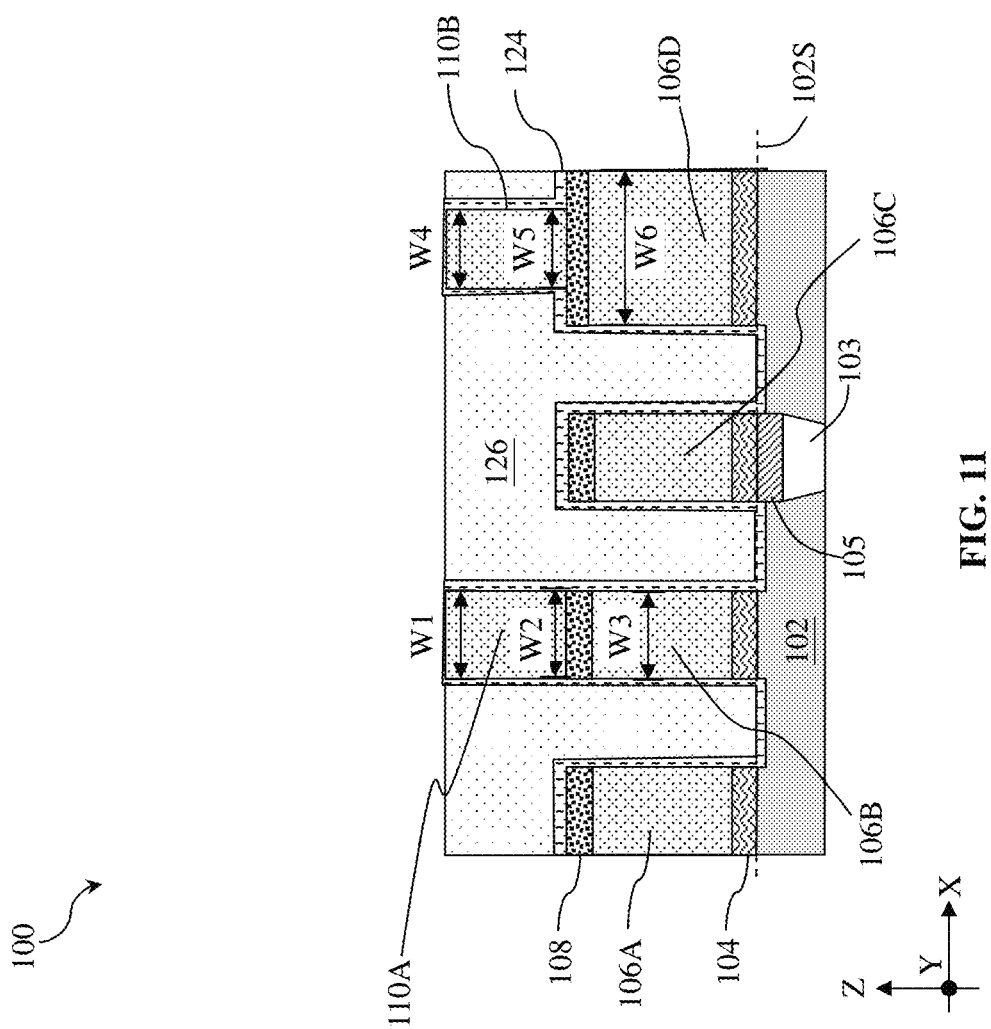

Referring now to FIGS. 1B and 11, the method 10 includes a block 34 where a planarization process is performed to provide a planar top surface. In some embodiments, the workpiece 100 may be subject to a chemical mechanical polishing (CMP) process until the cap layer 114 is removed or until the second glue layer 112 is removed. In the embodiment shown in FIG. 11, the workpiece 100 is planarized until the second glue layer 112 is removed. At this point, in the cross-section illustrated in FIG. 11, a first conductive line feature 106A, a second conductive line feature 106B, a third conductive line feature 106C, a fourth conductive line feature 106D, a first contact via 110A, and a second contact via 110B are formed.

Referring still to FIG. 11, the first conduct via 110A is disposed over the second conductive line feature 106B and is electrically coupled to the second conductive line feature 106B via the conductive etch stop layer 108. The second contact via 110B is disposed over the fourth conductive line feature 106D and is electrically coupled to the fourth conductive line feature 106D via the conductive etch stop layer 108. The portions of the second metal layer 110 over the first conductive line feature 106A and the third conductive line feature 106C are removed as they are not protected by the dielectric layer 122 at block 26.

In some implementations, the first contact via 110A has a uniform width along the X direction throughout its height along the Z direction. That is, a top end of the first contact via 110A has a first width W1 along the X direction and a bottom end of the first contact via 110A has a second width W2 along the X direction. W1 is substantially identical to W2. In some implementations, the first contact via 110A is coterminous (along the X direction) with the second conductive line feature 106B below. That is, a third width W3 of the second conductive line feature 106B is substantially identical to the first width W1 and the second width W2. The same applies to the conductive etch stop layer 108 between the first contact via 110A and the second conductive line feature 106B. A width of the conductive etch stop layer 108 along the X direction is substantially identical to the first width W1, the second width W2 and the third width W3. In those implementations, sidewalls of the first contact via 110A are flush with sidewalls of the conductive etch stop layer 108 as well as sidewalls of the second conductive line feature 106B. In some embodiments represented in FIG. 11, the second contact via 110B has a uniform width along the X direction throughout its length along the Z direction. That is, a top end of the second contact via 110B has a fourth width W4 and a bottom end of the second contact via 110B has a fifth width W5. The fourth width W4 is substantially identical to the fifth width W5. In some instances, the second contact via 110B is narrower than the fourth conductive line feature 106D. The fourth conductive line feature 106D has a sixth width W6 along the X direction and W6 is greater than W4 and W5. In a different aspect, sidewalls of the first contact via 110A, the second contact via 110B are upright and extend perpendicular to a top surface of the substrate.

As illustrated in FIG. 11, the first barrier layer 124 extends continuously from sidewalls of the first contact via 110A to sidewalls of the second conductive line feature 106B. The first barrier layer 124 also extends along sidewalls of the conductive etch stop layer 108 sandwiched between the first contact via 110A and the second conductive line feature 106B. Because the fourth width W4 and the fifth width W5 are smaller than the sixth width W6, the second contact via 110B is disposed over a portion of the conductive etch stop layer 108 on the fourth conductive line feature 106D while leaving another portion of the conductive etch stop layer 108 exposed (before the deposition of the first barrier layer 124). In the embodiments represented in FIG. 11, the first barrier layer 124 extends from sidewalls of the second contact via 110B, onto top-facing surfaces of the conductive etch stop layer 108, and then to sidewalls of the fourth conductive line feature 106D. In addition, in embodiments illustrated in FIG. 11, the first barrier layer 124 may extend below a top surface 102S of the substrate 102 and may be deposited on the portion of the top surface 102S between two neighboring conductive lines.

Figure 12:
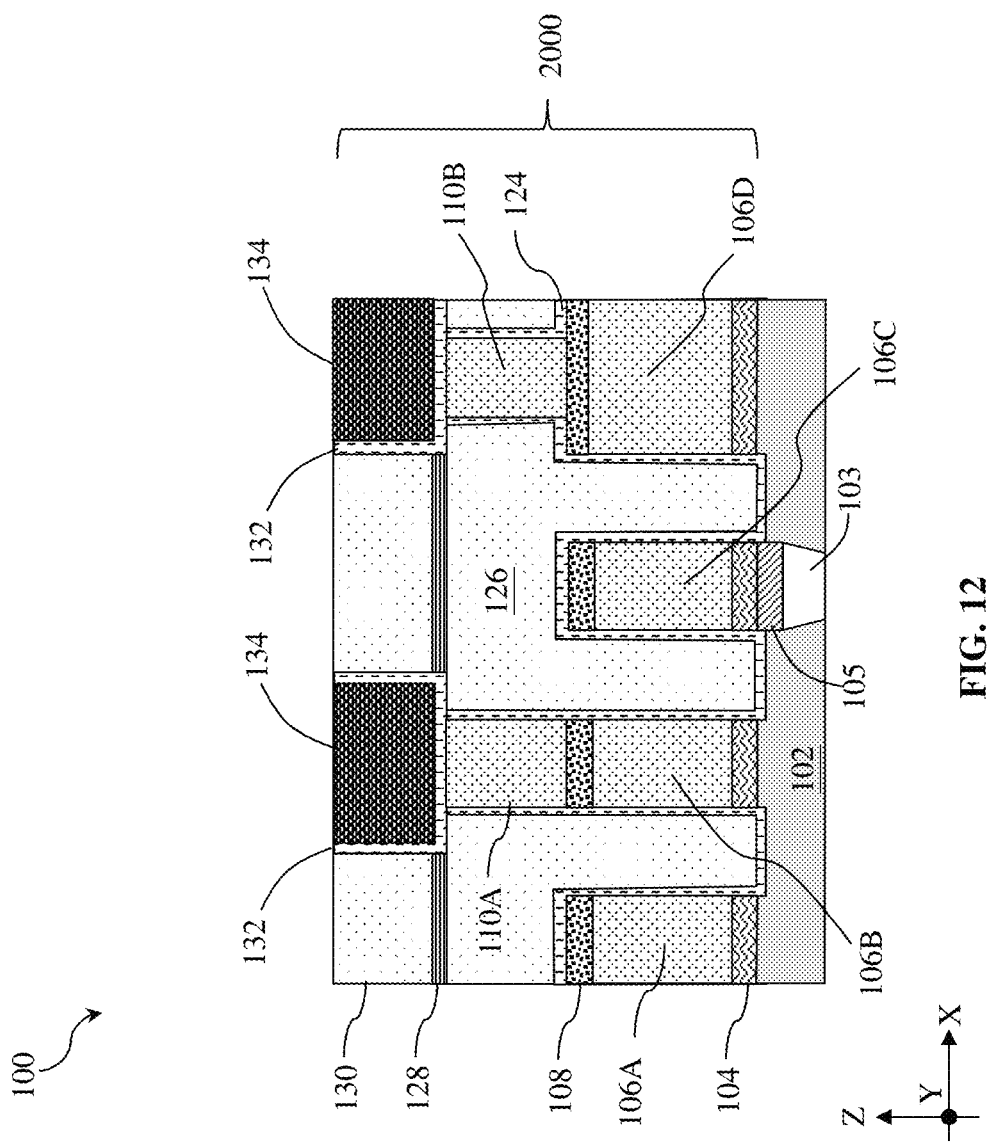

Referring now to FIGS. 1B and 12, the method 10 includes a block 36 where further processes are performed. In some embodiments, such further processes may include forming another interconnect layer using a single damascene process. For example, such further processes may include depositing an etch stop layer 128 and a third ILD layer 130 over the workpiece 100, patterning the etch stop layer 128 and the third ILD layer 130 to form a trench, depositing of a second barrier layer 132 over the workpiece 100, depositing a metal fill layer 134 in the trench, and planarization of the workpiece 100. In some embodiments, the etch stop layer 128 is an insulative etch stop layer and may include silicon nitride, silicon carbonitride, silicon oxycarbide, silicon oxynitride, silicon oxycarbonitride, metal nitride, or metal oxide. The third ILD layer 130 and the second ILD layer 126 may have similar compositions. The second barrier layer 132 may be similar in composition to the first barrier layer 124. In some implementations, the another interconnect layer may include conductive lines that are electrically coupled to the first contact via 110A and the second contact via 110B. In FIG. 12, the structure above the substrate 102 may be referred to collectively as an interconnect structure 2000. The interconnect structure 2000 may include additional interconnect layers over the structure shown in FIG. 12.

Embodiments of the present disclosure provide advantages. Reference is now made to FIG. 12. The present disclosure provides methods of forming on a substrate a layer stack having a first metal layer and a second metal layer and patterning the first metal layer and the second metal layer to form a plurality of conductive line features and a plurality of contact vias, respectively. Due to the anisotropic nature of the patterning process, the contact vias so formed have straight sidewalls substantially perpendicular the substrate. As a result, each of the contact vias can be self-aligned with a conductive line below, eliminating possibilities of the "tiger teeth" that cause leakage. In addition, as compared to tilted sidewalls resulted from conventional dual damascene processes, the upright sidewalls of the contact vias allow further increase of pattern density, improving device performance. Furthermore, compared to conventional methods with dual damascene schemes, methods of the present disclosure include a single damascene scheme with improved process windows, making them more suitable for fabricating devices with small conductive features.

The present disclosure provides for many different embodiments. In one embodiment, an interconnect structure is provided. The interconnect structure includes a conductive line feature over a substrate, a conductive etch stop layer over the conductive line feature, a contact via over the conductive etch stop layer, and a barrier layer disposed along a sidewall of the conductive line feature, a sidewall of the conductive etch stop layer, and a sidewall of the contact via.

In some embodiments, a composition of the conductive etch stop layer is different from a composition of the conductive line feature. In some embodiments, the contact via includes a first end away from the substrate and a second end closer to the substrate than the first end and a width of the first end is substantially identical to a width of the second end. In some embodiments, wherein the sidewall of the contact via is flush with the sidewall of the conductive etch stop layer. In some implementations, the sidewall of the conductive line feature is flush with the sidewall of the conductive etch stop layer. In some instances, the barrier layer extends continuously along the sidewall of the conductive line feature, the sidewall of the conductive etch stop layer, and the sidewall of the contact via. In some embodiments, a first portion of the conductive etch stop layer is disposed between the conductive line feature and the contact via, a second portion of the conductive etch stop layer is not disposed between the conductive line feature and the contact via, and a portion of the barrier layer is disposed over the second portion. In some implementations, the interconnect structure further includes a glue layer between the conductive line feature and the substrate and the barrier layer extends into the substrate below the glue layer. In some instances, the barrier layer includes metal nitride.

In another embodiment, an interconnect structure is provided. The interconnect structure includes a first conductive line feature over a substrate, a second conductive line feature over the substrate, a conductive etch stop layer over the first and second conductive line features, a first contact via over a first portion of the conductive etch stop layer over the first conductive line feature, a second contact via over a second portion of the conductive etch stop layer over the second conductive line feature, and a barrier layer disposed along a sidewall of the first conductive line feature, a sidewall of the conductive etch stop layer, and a sidewall of the first contact via. A sidewall of the first contact via is flush with a sidewall of the first conductive line feature and a sidewall of the second portion of the conductive etch stop layer is flush with a sidewall of the second conductive line feature.

In some embodiments, the first and second conductive line features include ruthenium, copper, cobalt, aluminum, or a combination thereof and the conductive etch stop layer includes tungsten, tantalum, or a combination thereof. In some embodiments, the first contact via includes a first end away from the substrate and a second end closer to the substrate than the first end, and a width of the first end is substantially identical to a width of the second end. In some implementations, the barrier layer extends continuously along the sidewall of the first conductive line feature, the sidewall of the first portion of the conductive etch stop layer, and the sidewall of the first contact via. In some embodiments, a portion of the barrier layer is disposed over the second portion of the conductive etch stop layer. In some instances, the interconnect structure of claim further includes a glue layer between the first conductive line feature and the substrate and the barrier layer extends into the substrate below the glue layer. In some embodiments, the barrier layer includes nitrogen.

In still another embodiment, a method is provided. The method includes depositing a layer stack over a substrate. The layer stack includes a first metal layer, a conductive etch stop layer over the first metal layer, a second metal layer over the conductive etch stop layer, and a cap layer over the second metal layer. The method further includes patterning the layer stack to form conductive line features out of the first metal layer and contact vias out of the second metal layer.

In some embodiments, the layer stack further includes a first glue layer between the first metal layer and the substrate, and a second glue layer between the second metal layer and the cap layer. In some implementations, the patterning of the layer stack includes etching the layer stack to form first openings along layer stack features, depositing a protection layer over the layer stack features, depositing a hard mask layer over the layer stack features, patterning the hard mask layer to form second openings, depositing a reverse material in the second openings, and patterning the layer stack features using the reverse material as an etch mask. In some instances, the method further includes depositing a barrier layer over the conductive line features and the contact vias. In some embodiments, a plurality of the contact vias is disposed over a plurality of the conductive line features and the barrier layer extends from sidewalls of the plurality of the contact vias to sidewalls of the plurality of the conductive line features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure comprising:
   a substrate;
   a glue layer over the substrate;
   a first conductive line disposed on a first portion of the glue layer;
   a first portion of a conductive etch stop layer (ESL) disposed on the first conductive line; and
   a barrier layer extending continuously along a sidewall of the first portion of the glue layer, a sidewall of the first conductive line, a sidewall of the first portion of the conductive ESL, and a top surface of the first portion of the conductive ESL.

2. The interconnect structure of claim 1, further comprising:
   a dielectric layer over the substrate and the barrier layer.

3. The interconnect structure of claim 1, wherein the glue layer comprises silicon, silicon nitride, silicon carbonitride, silicon oxynitride, silicon oxycarbide, a metal, a metal oxide, or a metal nitride.

4. The interconnect structure of claim 1,
   wherein a composition of the first conductive line and a composition of the conductive ESL are different,
   wherein the first conductive line and the conductive ESL comprise copper (Cu), cobalt (Co), ruthenium (Ru), molybdenum (Mo), chromium (Cr), tungsten (W), manganese (Mn), rhodium (Rd), iridium (Ir), nickel (Ni), palladium (Pd), platinum (Pt), silver (Ag), gold (Au), tantalum (Ta), aluminum (Al), or a combination thereof.

5. The interconnect structure of claim 1,
   wherein the first conductive line comprises ruthenium (Ru),
   wherein the conductive ESL comprises tantalum (Ta) or tungsten (W).

6. The interconnect structure of claim 1, wherein the barrier layer comprises silicon carbonitride, silicon nitride, silicon oxycarbide, metal nitride, metal oxide, or a combination thereof.

7. The interconnect structure of claim 1, wherein the sidewall of the glue layer, the sidewall of the first conductive line, and the sidewall of the conductive ESL are substantially perpendicular to the substrate.

8. The interconnect structure of claim 1, further comprising:
   a second conductive line disposed on a second portion of the glue layer;
   a second portion of the conductive ESL disposed on the second conductive line; and
   a contact via disposed on the second portion of the conductive ESL,
   wherein the barrier layer extending continuously along a sidewall of the second portion of the glue layer, a sidewall of the second conductive line, a top surface of the second portion of the conductive ESL, a sidewall of the second portion of conductive ESL, and a sidewall of the conductive via.

9. The interconnect structure of claim 8, wherein the sidewall of the conductive via is substantially perpendicular to the substrate.

10. An interconnect structure comprising:
    an interlayer dielectric layer (ILD);
    a conductive feature disposed in the ILD;
    a cap layer disposed on the conductive feature;
    a glue layer over the cap layer;
    a conductive line disposed on the glue layer;
    a conductive etch stop layer (ESL) disposed on the conductive line; and
    a barrier layer extending continuously along a sidewall of the glue layer, a sidewall of the conductive line, a sidewall of the conductive ESL, and a top surface of the conductive ESL.

11. The interconnect structure of claim 10, wherein the conductive feature comprises Cu, Co, Ru, Mo, Cr, W, Mg, Rd, Ir, Ni, Pd, Pt, Ag, Au, Ta, Al, or a combination thereof.

12. The interconnect structure of claim 10, wherein the cap layer comprises a metal or a metal nitride.

13. The interconnect structure of claim 10, wherein the glue layer comprises silicon, silicon nitride, silicon carbonitride, silicon oxynitride, silicon oxycarbide, a metal, a metal oxide, or a metal nitride.

14. The interconnect structure of claim 10,
    wherein a composition of the conductive line and a composition of the conductive ESL are different,
    wherein the conductive line and the conductive ESL comprise copper (Cu), cobalt (Co), ruthenium (Ru), molybdenum (Mo), chromium (Cr), tungsten (W), manganese (Mn), rhodium (Rd), iridium (Ir), nickel (Ni), palladium (Pd), platinum (Pt), silver (Ag), gold (Au), tantalum (Ta), aluminum (Al), or a combination thereof.

15. The interconnect structure of claim 10,
    wherein the conductive line comprises ruthenium (Ru),
    wherein the conductive ESL comprises tantalum (Ta) or tungsten (W).

16. The interconnect structure of claim 10, wherein the barrier layer comprises silicon carbonitride, silicon nitride, silicon oxycarbide, metal nitride, metal oxide, or a combination thereof.

17. An interconnect structure comprising:
    a substrate;
    a glue layer disposed on the substrate;
    a conductive line disposed on the glue layer;
    a conductive etch stop layer (ESL) disposed directly on top of the conductive line;
    a contact via disposed directly on a first portion of the conductive ESL;
    a barrier layer extending continuously from sidewalls of the contact via onto a top-facing surface of a second portion of the conductive ESL and then to sidewalls of the conductive line;
    a first dielectric layer over the substrate and the barrier layer;
    an etch stop layer (ESL) over the first dielectric layer and the conductive via;
    a second dielectric layer over the ESL; and
    a contact feature extending through the second dielectric layer and the ESL to interface a top surface of the conductive via.

18. The interconnect structure of claim 17, wherein conductive ESL comprises copper (Cu), cobalt (Co), ruthenium (Ru), molybdenum (Mo), chromium (Cr), tungsten (W), manganese (Mn), rhodium (Rd), iridium (Ir), nickel (Ni), palladium (Pd), platinum (Pt), silver (Ag), gold (Au), tantalum (Ta), aluminum (Al), or a combination thereof.

19. The interconnect structure of claim 17, wherein the ESL comprises silicon nitride, silicon carbonitride, silicon oxycarbide, silicon oxynitride, silicon oxycarbonitride, metal nitride, or metal oxide.

20. The interconnect structure of claim 17, wherein the sidewalls of the contact via and the conductive line are substantially perpendicular to the substrate.

* * * * *